(12) United States Patent
Tsai et al.

(10) Patent No.: US 6,592,817 B1
(45) Date of Patent: Jul. 15, 2003

(54) MONITORING AN EFFLUENT FROM A CHAMBER

(75) Inventors: Kenneth Tsai, Emerald Hills, CA (US); Tung Bach, Milpitas, CA (US); Quyen Pham, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/540,771

(22) Filed: Mar. 31, 2000

(51) Int. Cl.[7] .............................................. G01N 33/00
(52) U.S. Cl. ............................ 422/62; 422/83; 422/91; 422/104; 436/43; 436/164
(58) Field of Search .......................... 422/62; 356/72, 356/437; 156/345; 118/722, 708; 451/6; 438/513, 7

(56) References Cited

U.S. PATENT DOCUMENTS

| | | | |
|---|---|---|---|
| 4,609,426 A | | 9/1986 | Ogawa et al. |
| 4,609,810 A | | 9/1986 | O'Brien |
| 4,859,277 A | * | 8/1989 | Barna et al. ................... 438/7 |
| 5,002,631 A | | 3/1991 | Giapis et al. |
| 5,288,367 A | | 2/1994 | Angell |
| 5,308,414 A | | 5/1994 | O'Neill |
| 5,348,614 A | | 9/1994 | Jerbic |
| 5,565,114 A | | 10/1996 | Saito et al. |
| 5,632,821 A | | 5/1997 | Doi |
| 5,880,850 A | * | 3/1999 | McAndrew et al. ......... 356/437 |
| 6,146,242 A | * | 11/2000 | Treur et al. ..................... 451/6 |
| 6,159,297 A | * | 12/2000 | Herchen et al. ............. 118/708 |
| 6,207,008 B1 | * | 3/2001 | Kijima ......................... 156/345 |
| 6,235,119 B1 | * | 5/2001 | Yang ........................... 118/722 |
| 6,300,227 B1 | * | 10/2001 | Liu et al. ..................... 438/513 |
| 6,306,246 B1 | * | 10/2001 | Melvin et al. ............... 156/345 |
| 6,366,346 B1 | * | 6/2002 | Nowak et al. ................ 356/72 |

FOREIGN PATENT DOCUMENTS

EP 0859250 8/1998

OTHER PUBLICATIONS

International Search Report, dated Apr. 13, 2000.
International Application Published Under The Patent Cooperation Treaty, WO 99/06610, dated Feb. 11, 1999.
U.S. Patent Application entitled "Method and Apparatus for Optical Detection of Effluent Composition," filed Nov. 19, 1998 ; Serial No. 09/196,459; Inventors: Nowak, et al.; Attorney Docket No. 2376.
Steven Cambell, "The Science and Engineering of Microelectronic Fabrication" (1996) p. 291.

* cited by examiner

*Primary Examiner*—Jill Warden
*Assistant Examiner*—Brian Sines
(74) *Attorney, Agent, or Firm*—Janah & Associates

(57) ABSTRACT

An effluent monitoring apparatus 10 comprising an energizing cell 22 adapted to receive an effluent, a gas energizer 17 that is capable of energizing the effluent in the cell 22 thereby emitting a radiation, a radiation permeable window 27 that is spaced apart from the wall 36 of the 22 cell by a distance d that is sufficiently high to reduce a deposition of effluent residue from the energized gas on the window 27, and a detector 26 to detect the radiation.

44 Claims, 8 Drawing Sheets

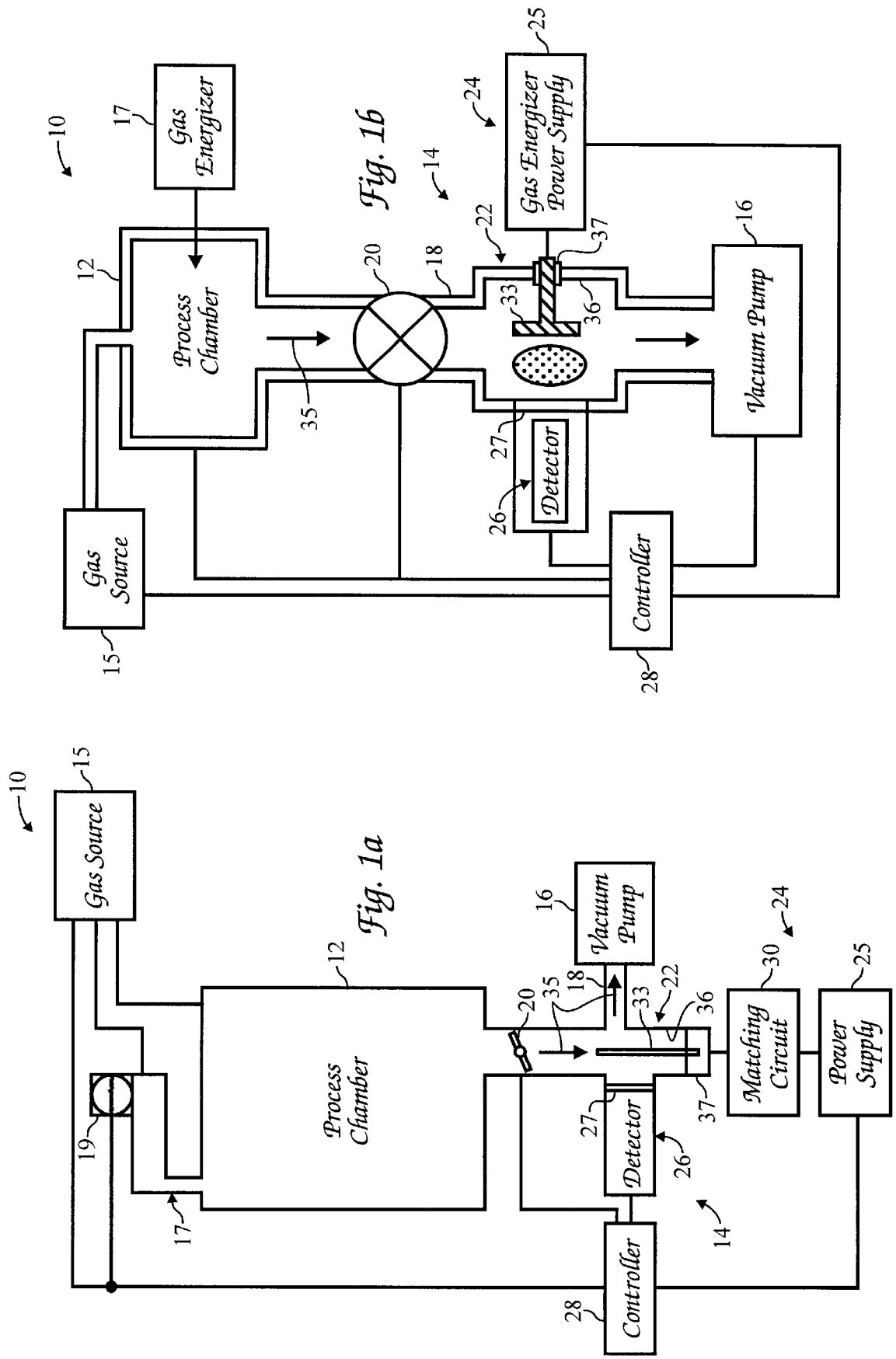

MONITORING AN EFFLUENT FROM A CHAMBER

BACKGROUND

The invention relates to the monitoring of an effluent from a process chamber.

In the processing of substrates, semiconductor, dielectric, and conductor materials, such as for example, polysilicon, silicon dioxide, aluminum and/or tungsten silicide, are formed on a substrate by chemical vapor deposition (CVD), physical vapor deposition (PVD), oxidation and nitridation processes. For example, in CVD processes, a reactive gas is used to deposit material on the substrate, and in PVD processes, a target is sputtered to deposit material on the substrate. In oxidation and nitridation processes, an oxide or nitride material, typically silicon dioxide or silicon nitride, respectively, is formed on the substrate by exposing the substrate to a suitable gaseous environment. In conventional etching processes, a patterned mask of photoresist or oxide hard mask is formed on the substrate by lithographic methods, and the exposed portions of the substrate are etched typically by energized gas to form patterns of gates, vias, contact holes or interconnect lines. During such processes, process residues often deposit on the walls, components and other surfaces in the chamber. The process residues are undesirable because they can flake off and contaminate the substrate on which they deposit. In a conventional process, the etchant residue is periodically cleaned off the surfaces in the chamber. For example, in one method, after processing a batch of substrates, a dry-cleaning process is used to clean the chamber surfaces with an energized cleaning gas. In another method, the cleaning gas is added to the etchant gas, and the resultant gas composition is energized to both etch the substrate and clean the surfaces in the chamber.

In such processes, it is often desirable to stop processing after a predetermined period, at an end of a processing stage, or at a process endpoint. For example, when performing a chamber cleaning process, it may be desirable to stop the cleaning process when substantially all, or a portion, of the process residue deposited on the chamber surfaces have been cleaned, i.e., they have been removed or prevented from being deposited. Excessive cleaning may shorten the lifetime of chamber components or otherwise degrade subsequent substrate processing. However, when the thickness of the process residue varies in the processing of one substrate or another, it may be difficult to uniformly clean the chamber in each cleaning cycle. Also, the efficiency of the cleaning process at different locations across the chamber may depend upon plasma density and distribution. Accordingly, it may be difficult to determine completion of the cleaning process.

Thus, it is desirable to stop processing after a predetermined period or to determine a process endpoint, such as an endpoint of a chamber cleaning process. It is also desirable to clean chamber walls and surfaces without erosion of chamber surfaces.

SUMMARY

The present invention satisfies these needs. In one version, the invention comprises an effluent monitoring apparatus comprising a cell adapted to receive an effluent, a gas energizer capable of energizing the effluent in the cell thereby emitting a radiation, a radiation permeable window that is spaced apart or recessed from a wall of the cell by a distance d that is sufficiently high to reduce a deposition of process residue from the energized gas on the window, and a detector to detect the radiation. The window may be located in a port which has an aspect ratio that is sufficiently high to reduce the deposition of effluent residue from the energized gas on the window.

In another aspect, the invention comprises a method of monitoring a composition of an effluent from a process chamber, the method comprising introducing the effluent into an effluent energizing cell, energizing the effluent in the cell, maintaining a radiation permeable window spaced apart from a wall of the cell at a distance d that is sufficiently large to reduce the deposition of effluent residue on the window, and detecting a radiation emanating from the energized gas and passing through the window.

In yet another aspect, the invention comprises a chamber cleaning apparatus comprising a chamber comprising a support capable of supporting a substrate during processing, a gas supply to provide a cleaning gas to the chamber, a gas energizer to energize the cleaning gas, and an exhaust to remove spent cleaning gas from the chamber; and a process monitoring system comprising a gas energizing cell in the exhaust to receive spent cleaning gas, a gas energizer capable of energizing the gas in the cell, a window assembly comprising a radiation permeable portion that is spaced apart from the cell wall at a distance that is sufficiently large to reduce the deposition of effluent residue on the radiation permeable portion, and a detector to detect a radiation emanating from the energized gas.

In a further aspect, the invention comprises an effluent monitoring apparatus comprising a cell to receive effluent, one or more electrodes in the cell that are chargeable to form a plasma from the effluent in the cell, a detector assembly comprising a radiation permeable window, and a sensor behind the window to detect radiation emanating from the plasma, and optional optics, wherein the detector assembly is set to selectively receive radiation originating from the front of an electrode in the cell.

In another aspect, the invention comprises a method of monitoring an effluent, the method comprising introducing an effluent into a cell, applying a bias voltage to one or more electrodes in the cell to form a plasma of the effluent, providing a radiation permeable window in the cell, and detecting radiation emanating from the front of an electrode.

In yet another aspect, the invention comprises a chamber cleaning apparatus comprising a chamber comprising a support capable of supporting a substrate during processing, a gas supply to provide a cleaning gas to the chamber, a first gas energizer to energize the cleaning gas, and an exhaust to exhaust cleaning gas; and a process monitoring system comprising a cell adapted to receive cleaning gas, electrodes that may be biased to energize the cleaning gas in the cell, a detector assembly comprising a radiation permeable window and a detector to detect radiation emanating from the energized cleaning gas in front of the electrode.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

FIG. 1a is a simplified diagram of a substrate processing apparatus having a process chamber and an effluent monitoring system with an effluent energizing cell;

FIG. 1b is a simplified diagram of another embodiment of a substrate processing apparatus having an in-line effluent monitoring system;

FIG. 2b is a simplified sectional diagram of a portion of the cathode assembly of the effluent energizing cell of FIG. 2a;

FIG. 2c is a simplified exploded view of the effluent energizing cell of FIG. 2a;

DESCRIPTION

Figure 2B:
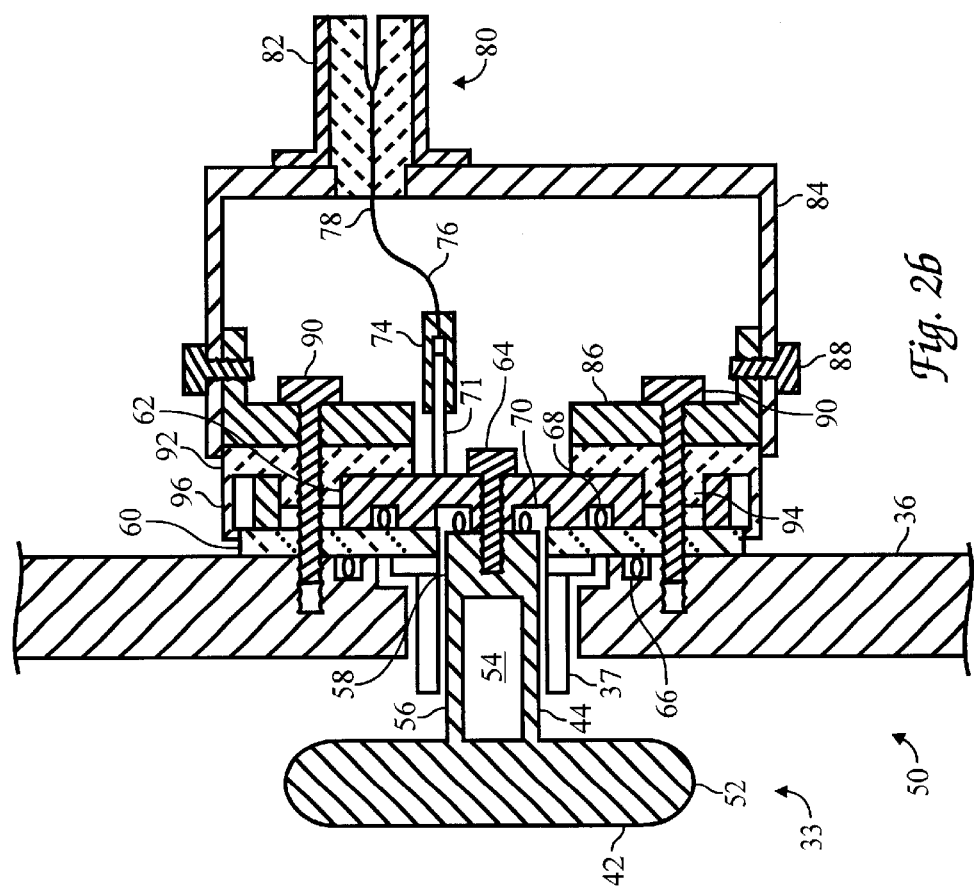

FIG. 1a is a simplified diagram of a substrate processing apparatus 10 according to one embodiment of the present invention, the apparatus 10 comprises a process chamber 12 and a process monitoring system 14 capable of monitoring a process being performed in the chamber, for example, by plasma emission analysis. The process chamber 12 is used in the manufacture of electronic devices, for example, to form a layer of dielectric material, such as silicon oxide or silicon nitride, a layer of metal, such as aluminum, copper, titanium, platinum, or tungsten, or a layer of semiconductor material, such as silicon, germanium, or a compound semiconductor, on a substrate, such as a silicon, compound semiconductor or semiconductor-on-insulator wafer.

The process chamber 12 comprises a gas source 15 that provides a precursor gas, to a process gas energizer 17, such as a remote microwave plasma generator. The microwave plasma generator uses a microwave source 19 such as a magnetron, to convert a precursor gas into dissociated species that contain free fluorine radicals and other plasma species, which are conveyed into the chamber 12. For example, a process gas comprising $C_2F_6$, $CF_4$ or $NF_3$, may be dissociated to form fluorine radicals that may combine with process residue in the chamber 12, such as silicon oxide, to form volatile compounds, such as silicon-fluorides, which are removed by the exhaust. A typical microwave plasma generator operates at 2.45 GHz and is efficient at breaking down the precursor and generating chemically active fluorine radicals.

A vacuum pump 16 is connected to the process chamber by a foreline 18 which serves as a vacuum conduit, to exhaust effluent from the chamber 12, which may include un-reacted gas as well as reaction byproducts. An optional throttle valve 20 can provide further control over the chamber pressure to maintain a gas pressure in the process chamber 12 in conjunction with the gas flow supplied by the gas source 15.

A gas energizing cell 22 comprises a gas energizer 24 to energize the effluent passing through the cell 22. For example, the gas energizer 24 may form a plasma from the effluent in the exhaust by coupling electromagnetic energy into the effluent in the cell, such as by capacitive or inductive energy coupling. In one version, as shown, the gas energizer 24 comprises electrodes such as the cathode 33, that may be energized to form a plasma in the cell 22. Typically, the gas energizing cell 22 is placed just downstream from the throttle valve 20 in the effluent foreline 18, thereby reducing the distance from the process chamber 12 while isolating the plasma in the cell 22 from the process chamber 12.

A detector 26 placed outside a window 27 in the foreline 18, is adapted to detect radiation in the optical, infra-red or ultra-violet spectrum, that is emitted by the plasma, and convert it into a voltage signal. A controller 28 receives the signal(s) from the detector 26. The controller can perform calculations and comparisons based on the received signals to control process parameters. For example, the controller 28 may shut off a gas flow from the gas source 15 to the process chamber 12 when a signal from the detector 26 indicates that the end of a process has occurred. The detector 26 detects radiation emitted by the energized gas and the detector 26 or the controller 28 may use this signal to determine the type and concentration of substances in the gas. Different substances emit radiation having different wavelengths when excited and the amplitude of a detected wavelength provides an indication of the amount or concentration of a particular substance in the exhaust stream.

In one version, the gas energizer 24 of the gas energizing cell 22 comprises a power supply 25 that is a commercially available switching power supply of the type used with fluorescent lighting that can run off of a standard 110 V, 60 Hz power line. The power supply 25 is capable of, for example, generating about 30 Watts of power at 31 KHz. The operating frequency of the power supply 25 may be a low frequency (relative to RF frequencies) to simplify matching load to source impedances, for example, from about 10 to about 2000 kHz, or for example, from about 10 to about 200 kHz. Without any load matching, it is estimated that from about 8 to about 15 Watts of power may be delivered to the plasma, or for example, about 10 Watts. A matching circuit 30 between the power supply 25 and the gas energizing cell 22 may be added to improve the efficiency of the power delivered to the plasma, which may allow the use of an even smaller power supply, or may allow the gas energizing cell 22 to form a plasma in the foreline 18 over a wider range of operating conditions, such as foreline pressure and effluent composition. A higher operating frequency may be more desirable if ion etching of the gas energizing cell 22 compromises its operating life. Typically, the operating frequency chosen for an in-situ plasma system balances several factors, such as plasma generation efficiency, plasma uniformity, plasma processing characteristics, electromagnetic interference, and size and cost of the power supply. A common operating frequency is 13.56 MHz, which provides a desirable balance between several factors and is allocated for commercial use by the Federal Communication Commission (FCC). The present invention has a much wider range of choices for operating frequency because the plasma characteristic of interest is the optical emission from the plasma. The plasma may be small and dilute, and a much lower power supply may be used, thus also limiting the undesirable electromagnetic emissions.

FIG. 1b is a simplified diagram of a substrate processing apparatus 10 having a process monitoring system 14 with an in-line gas energizing cell 22, according to another embodiment of the present invention. Because the gas energizing cell 22 is placed in a vertical orientation directly beneath the process chamber 12, a more laminar and less turbulent flow of effluent through the gas energized cell 22 may be obtained. This reduces the possibility that effluent gas will diffuse back into the process chamber 12. In addition, a laminar effluent flow may allow energizing radiation to be coupled to the effluent in a higher strength because the effluent flows continually and uniformly past the surface of an elongated process electrode or cathode 33 that is substantially co-axial with the exhaust flow, as represented by the arrow 35. The cathode 33 is electrically isolated from the conductive wall 36 of the gas energizing cell 22 by an isolator 37. The power supply 25 of the cell 22 is connected to the cathode 33, and to the conductive wall 36 which forms an anode of the cell 22. Optical emissions generated in the cell 22 are transmitted through a window 27 to one or more optical detectors 26a, 26b.

Figure 2A:
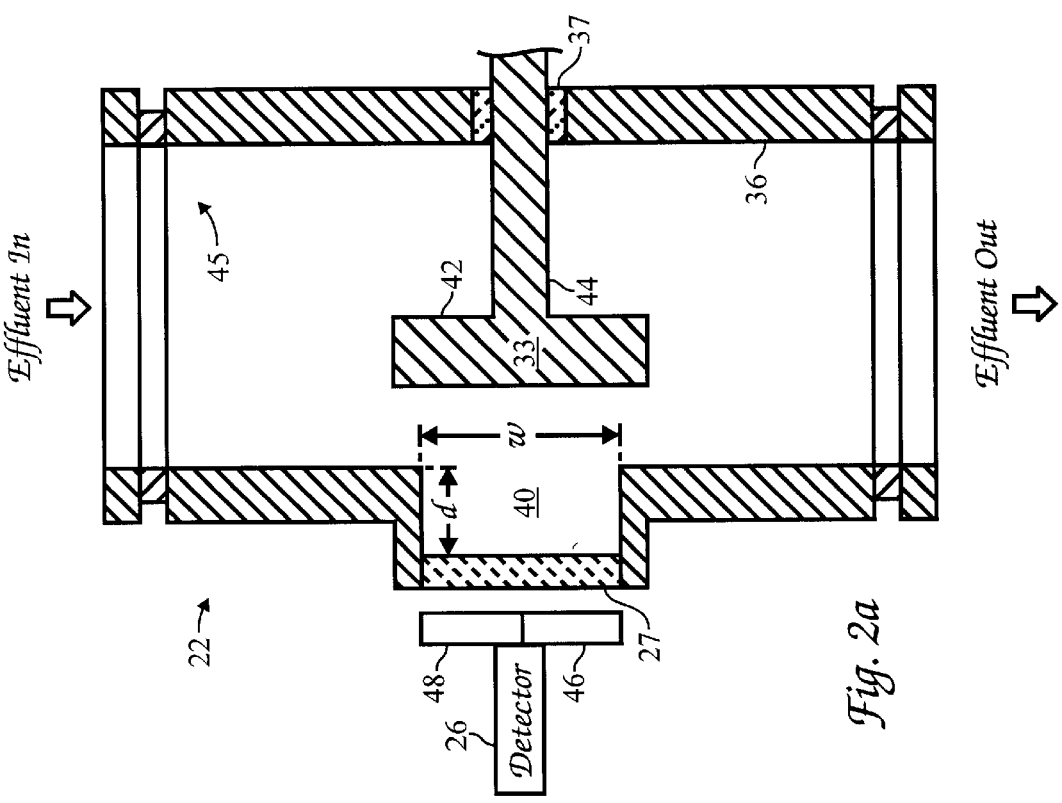
FIG. 2a is a simplified sectional diagram of an embodiment of an effluent energizing cell.

FIG. 2a is a simplified view of one embodiment of an effluent energizing cell 22. The effluent flow can be energized by coupling input energy in various ways, for example, capacitively, inductively, or by applying microwave energy, in some combination. The cell 22 that is shown in FIG. 2a energizes the effluent by capacitively coupling power to gas within the cell. The cathode 33 is the powered electrode and is separated from the wall 36 that forms the anode or grounded electrode, by an electrical isolator 37. The anode 36 and cathode 33 are typically made of aluminum, but could be made from a variety of other conductive materials. The cathode 33 has a co-axial portion 42 and a transverse portion 44. The isolator 37 may be made from a material with suitable dielectric breakdown strength that is compatible with the expected environment(s) within the foreline. Suitable materials for the isolator 37, in some applications, include acetal resin, polytetrafluoroethelyene, such as Teflon®, or ceramic. The surface area of the cathode 33 may be closely matched to the surface area of the anode 36 to provide larger-area electrodes when using a lower-frequency generator to power a gas energizing cell to reduce gas erosion of the cathode or anode.

The window 27 is made from a material that is chosen to be compatible with the constituents of the plasma effluent stream and permeable to the radiation emissions of interest. For example, the window 27 may be permeable to ultraviolet, visible or infrared radiation, and made of a ceramic, such as for example, one or more of $Al_2O_3$, Si, $SiO_2$, $TiO_2$, $ZrO_2$ or mixtures and compounds thereof. The surfaces of the window 27 may be polished smooth, for example, by flame polishing, lapping or ablating, to provide a peak-to-peak RMS roughness (i.e., the vertical distance between the peaks and valleys of the roughness) that is sufficiently small to reduce scattering of radiation passing through the window, for example, scattering of visible, ultraviolet and infra-red radiation is reduced when the window 27 has a surface roughness of less than about 1 $\mu$m. In one embodiment, the window 27 is made from single-crystal alumina, commonly called sapphire, but it may also be made from fused silica, commonly called "quartz". Filters 46, 48 are placed between the window and detector 26, respectively, to pass through radiation at predefined frequencies from the plasma formed in the effluent in the gas energizing cell 22. Alternatively, a detector 26 could provide a signal to an optical spectrum analyzer, which could analyze several frequencies of the unfiltered optical emissions. Although two filters and one detector are shown, more or fewer detectors and filters could be employed.

When energizing the effluent, it was discovered that energizing the effluent gas causes effluent residues to form on the window 27 and adjacent walls 36 of the gas energizing cell 22. This is unexpected because the process gas is largely depleted or spent in the chamber 12. For example, when the composition of the process gas is tailored to deposit material on the substrate, the process gas is decomposed in the chamber 12 to form the deposits. The effluent of the decomposed gas contains substantially only spent gaseous byproducts and only has a limited ability to generate additional residues. Similarly, when etchant gas is used to etch a material on the substrate, the effluent from the etchant gas has reduced etching capability and reduced etchant species. Accordingly, it is unexpected that such process gases would form residues when energized in the effluent energizing cell 22.

The generation of effluent residues in the gas energizing cell 22 was even more unexpected when the effluent came from cleaning gas used to clean the chamber 12. Typically the cleaning gas comprises fluorine containing species that dissociate to form free fluorine radicals and plasma species in the chamber 12. The fluorine radicals combined with the process residue in the chamber 12, such as silicon dioxide to form volatile compounds, such as silicon-fluorides, which are present in the effluent that is energized in the gas energizing cell 22. It was believed that the silicon-fluoride containing gas effluent would not form effluent residues when energized. However, it was discovered that the effluent, when energized, generated a large amount of effluent residue that deposited on the walls of the gas energizing cell 22. In addition, when the window 27 is a wall of the gas energizing cell 22 the effluent residue deposited upon and clouded up the window. This resulted in attenuation of the radiation signal that was transmitted from the energized gas and detected by the detector 26 of the process monitoring system 14.

It was further discovered that by positioning the window 27 spaced apart from the wall 36 of the gas energizing cell 22 by a distance d that is sufficiently high reduces a deposition of effluent residue from the energized gas on the window 27. The optimal distance d depends upon the effluent gas flow rates, gas pressure and composition, and the resident-time of the effluent gas stream, because it is related to the mean free path of travel of the energized effluent species, their molecular sizes and their chemical reactivity. Generally, the higher the number of collisions the higher the rate of formation of the effluent residue on the window 27. In that case, it is desirable to space apart the window 27 a larger distance away from the wall 36. However, the window cannot be set back too far because this would increase the footprint of the apparatus 10 and thereby occupy too much space in the expensive clean room processing environments. For example, in a chamber cleaning operation, a suitable distance d that is sufficiently high to reduce or to substantially prevent the deposition of effluent residues on the energized gas on the window may be, for example, from about 2 mm to about 70 mm.

The spaced apart window 27 may be preferably located in a port 40 that extends outward of the gas energizing cell, as illustrated in FIG. 2a, to even more significantly reduce the deposition of effluent residues on the window 27. The port 40 forms a narrow channel that allows radiation to pass from the energized effluent, through the window 27 and to the detector 26, and it may have a cross-sectional shape that is circular, polygonal, triangular, hexagonal, square or rectangular. The port 40 functions by limiting or controlling the access of energized effluent species to the window 27 to reduce the formation of effluent residues on the window 27. The port 40 has a depth that is set at the distance d that it is desirable to maintain the window 27 spaced apart from the wall of the cell 22. A suitable depth or distance d depends upon the effluent gas pressure, composition, resident-time and gas flow rates, as a suitable depth d that is sufficiently long to reduce or even to substantially prevent the deposition of effluent residues on the energized gas on the window is, for example, from about 2 mm to about 70 mm. In addition, the width w of the port 40 should be sufficiently large that the summed intensity of the radiation from the energized effluent that passes through the port 40 may efficiently operate the process monitoring system 14. By width it is meant a breadth, side length, or diameter of the opening of the port 40, and for chamber cleaning processes, a suitable width is from about 3 mm to about 15 mm.

The shape and size of the port 40 provides its aspect ratio, which is the ratio of the width (w) to the depth (d) of the port 40, and which should be sufficiently high to reduce the deposition of effluent residues on the window 27. Selection of the appropriate aspect ratio, which may largely depend upon the process conditions in the chamber 12, can serve to regulate the access of energized gaseous species to the window 27 at the end of the port 40. In an embodiment suitable for use during a chamber cleaning process, the port 40 of the gas energizing cell 22 comprises an aspect ratio of at least about 1. The aspect ratio is generally from about 1 to about 8 for most chamber cleaning processes. For example, a port 40 having a width of 36 mm and a depth of 7.6 mm, which provides an aspect ratio (width/depth) of 4.75, resulted in little or no deposition of the effluent residue on the surface of the window 27 at the end of the port 40, in a cleaning process in which the chamber 12 was cleaned using a cleaning gas comprising $NF_3$ at a flow rate of 150 sccm at a pressure of from about 2 Torr to about 20 Torr.

It has been further discovered that the port 40 or detector 26 may be advantageously oriented to provide a field of view of the radiation in the cell 22 that is oriented preferentially across the front of the cathode 33 in the gas energizing cell 22, for example, to substantially exclude the field of view of the region around the cathode 22. Such an orientation allows the detector 26 to detect substantially only radiation from the energized effluent lying in front of the cathode 33. This embodiment is advantageous when the regions surrounding the cathode 33, for example, the wall 45 around the cathode 33, may cause erroneous fluctuations in the intensity of radiation emanating from this region. For example, in one embodiment, when the effluent was energized, effluent residues that formed on walls 45 of the chamber 22 were found to cause the walls 45 to change characteristics, for example, to turn lighter or darker in color. This affected the intensity of the radiation that was reflected from the walls 45 and that passed through the port 40 and into the field of view of the detector 26. Orienting the port 40 or detector 26 (which could be achieved by setting the detector optics or orienting the detector itself) to substantially face the cathode 33 to provide a field of view that covers substantially only the process electrode 33, while excluding most of the reflected radiation from the walls 45 and the peripheral region around the cathode 33, intensifies the true signal from the energized gas radiation in front of the cathode 33 and increases the signal to noise ratio of the detector 26.

The gas energizing cell 22 has several advantages. For example, the configuration of the gas energizing cell 22 allows use of a small, efficient, simple, and inexpensive power supply 25 to energize the process gas, for example, to form a plasma that generates sufficient optical emissions to allow monitoring of the effluent gas composition. Unlike in-situ plasmas, which typically must be physically large or dense to efficiently perform a processing operation in the chamber 12, the effluent or foreline plasma need only be large and dense enough to produce sufficient radiation to allow monitoring of the composition of the effluent stream. The gas energizing cell 22 can also operate over a wide range of pressures, as the operating pressure is not constrained by the requirements of an in-situ plasma process. In addition, placing the gas energizing cell 22 and detector 26 downstream of the throttle valve 20 causes negligible disruption of the gas flows within the process chamber 12. Consequently, existing processing systems can be retrofitted with a detector 26, such as an optical detector, and the gas energizing cell 22. However, a processing system may be designed with the detector 26 and gas energizing cell 22 further upstream, such as at an exhaust port or exhaust plenum of a chamber 12.

Figure 2C:
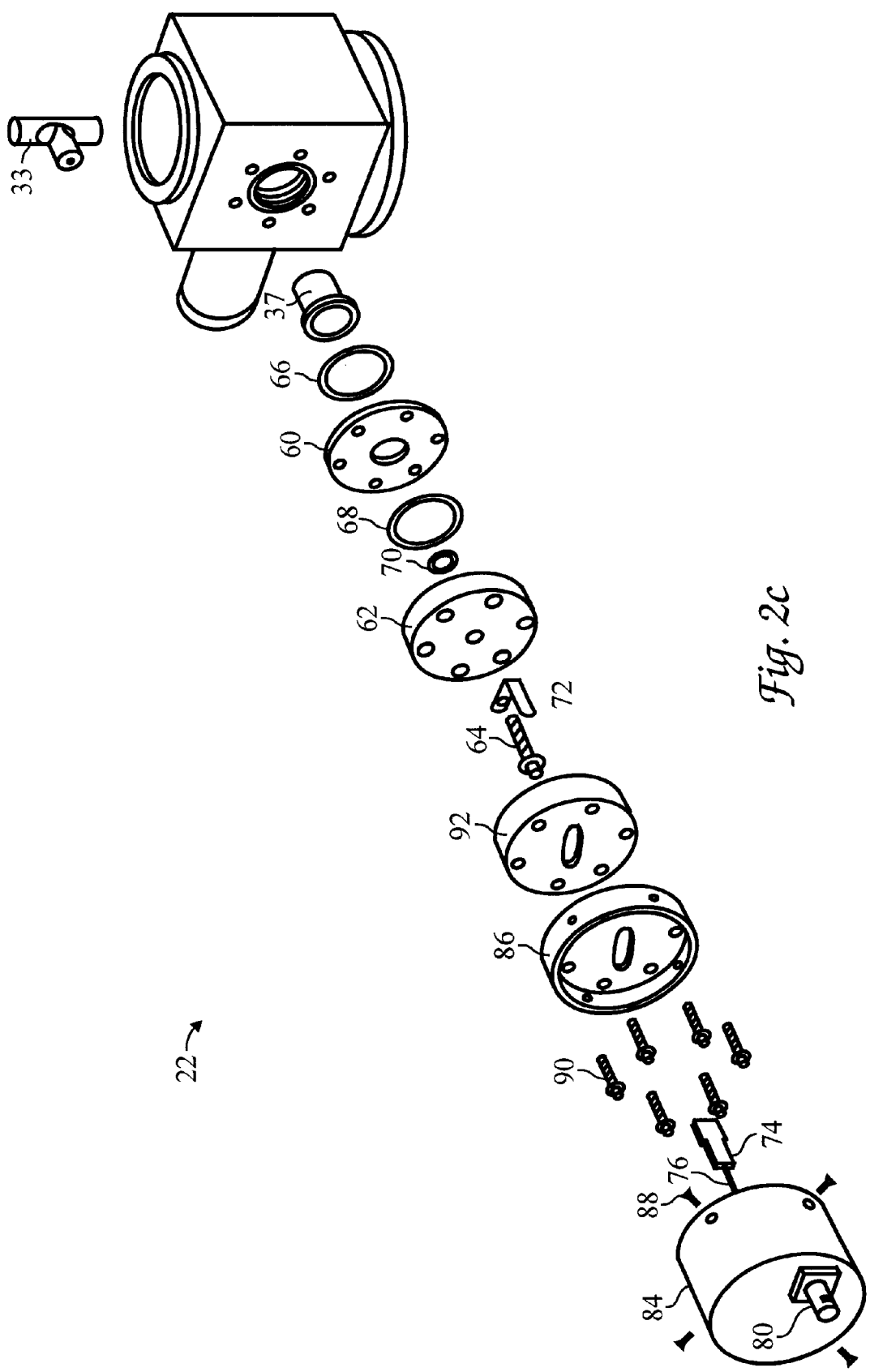

FIG. 2b shows more detail of a portion 50 of the gas energizing cell 22 shown in FIG. 2a, and FIG. 2c shows a simplified exploded view of the co-axial gas energizing cell 22. In this cell, the co-axial portion 42 of the cathode 33 is solid with rounded ends 52 that are provided to reduce plasma erosion that might otherwise occur if the co-axial portion 42 had square-cut ends. The transverse portion 44 of the cathode 33 is partially hollow 54 with a relatively thin wall 56. The thin wall 56 increases the thermal resistance between the co-axial portion 42 of the cathode and the wall 56 of the cathode. The isolator 37 is made of alumina ceramic and isolates the cathode 62 from the bottom gas energizing cell wall 36. An insulator plate 60 made of polytetrafluoroethelyene, such as Teflon®, insulates the aluminum cathode 62 from the wall 36 of the gas energizing cell 22. Polytetrafluoroethelyene is a desirable material for use in systems in which the effluent, and hence the plasma formed in the gas energizing cell 22, contains fluorine. A screw 64 mechanically and electrically connects the base 58 of the cathode 42 to the cathode plate 62. O-rings 66, 68, 70 form seals that prevent the effluent or plasma from corroding electrical connections or escaping from the gas energizing cell 22. A lug connector 72 is attached to the cathode plate 62 with the screw. A slide-on connector 74 attached to a wire 76 electrically connects the lug connector 72 to the center conductor 78 of a BNC connector 80. The outer conductor 82 of the BNC connector is electrically coupled to a cover plate 84, which is in turn electrically coupled to a pressure plate 86 through cover screws 88 and then to the wall 36 of the gas energizing cell through metal screws 90. The screws 90 hold the metal pressure plate 86 against an insulating spacer 92. The insulating spacer 92 is made of acetyl resin, but could be made from any of a variety of electrically insulating materials. The insulating spacer 92 has shoulders 94 that isolate the screws 90 from the cathode plate 62, and a collar 96 that covers the edge of the cathode plate when assembled.

Figure 2D:
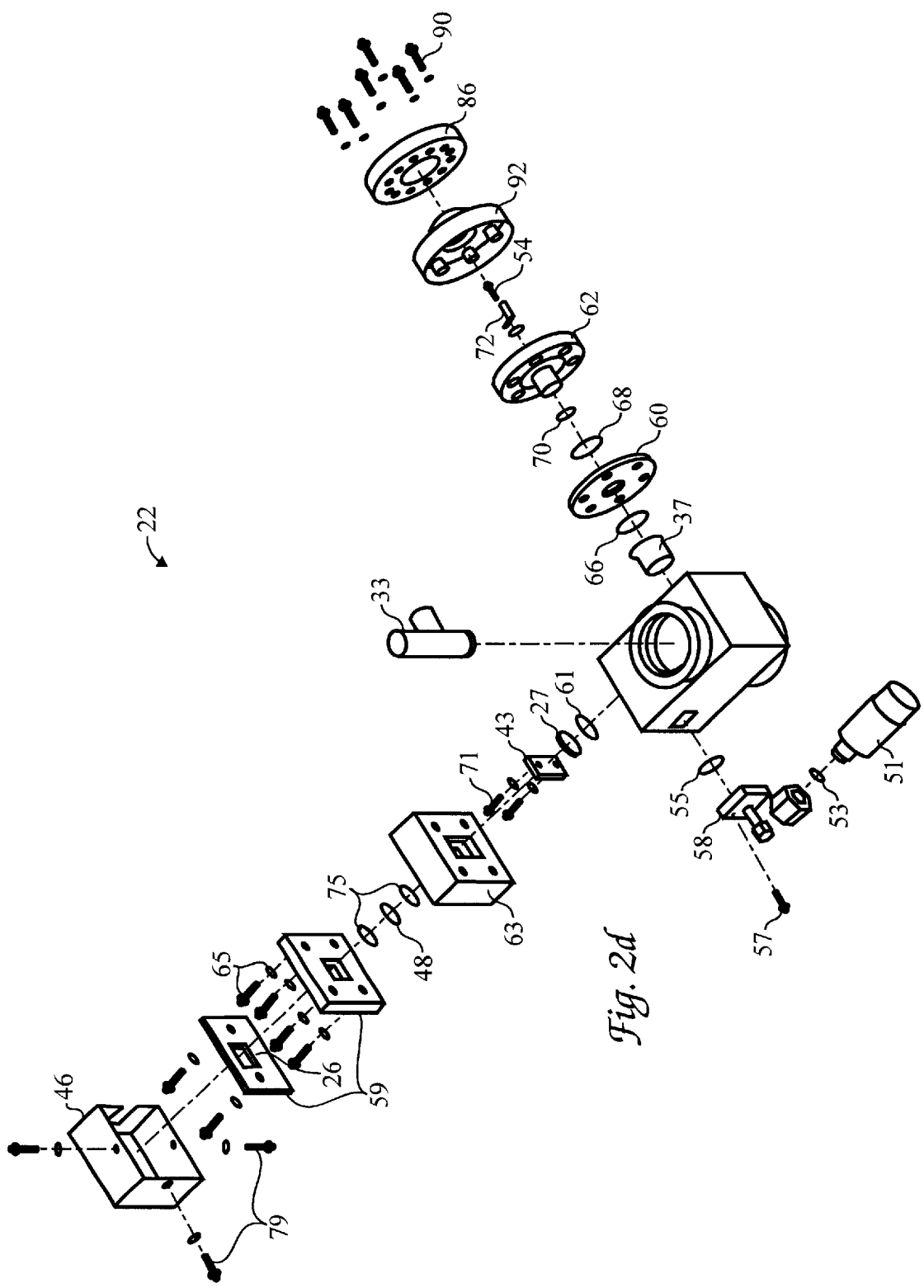
FIG. 2d is a simplified exploded view of another embodiment of an effluent energizing cell according to the present invention.

FIG. 2d is a simplified exploded view of another embodiment of an effluent energizing cell 22 that is suitable for detecting and monitoring a microwave generated cleaning plasma in a process chamber 12, and which has the same cathode assembly as that shown in FIG. 2c. In this cell, the detector 26 and detector optics 43 and 48 are housed in a housing 46. Radiation from the plasma in the cell 22 passes through a window 27 that is coated with a protective ultra-violet (UV) film and through a UV filter 43, both of which are sealed by an O-ring 61 and screw assemblies 71 in the housing plate 63. The radiation then passes though a second filter 48 which, for example, may be a 704 nm narrow band filter to selectively pass through the radiation of interest, and which is sealed by further gaskets 75. A number of further screw assemblies 65, 73 are used to hold the detector 26 to an assembly of plates 59 and in the housing 46. In addition, a safety switch 51 may be provided to detect if there is a vacuum in the cell 22 before the plasma is energized, for example, a 75 Torr VCR-4 close decreasing Torr switch, may be connected to the gas cell 22 via the flange 58, and by the screws 57, gasket 53 and O-ring seal 55.

Figure 3A:
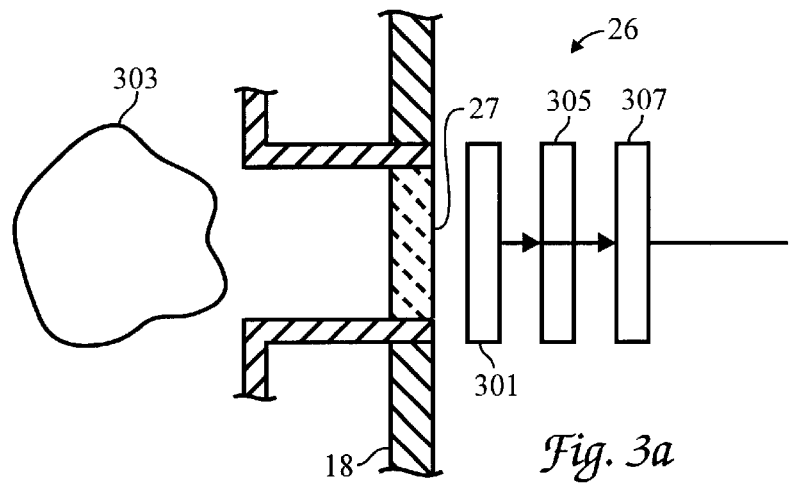
FIGS. 3a to 3c are simplified diagrams of detector optics of different versions of effluent monitoring systems according to the present invention.

FIG. 3a is a simplified representation of a detector 26 that may be used in the process monitoring system. The detector 26 can include an optical objective 301 to collect radiation having preselected wavelengths through the window 27 from the radiation discharge region 303 of the energized gas in the cell 22. In a preferred embodiment, the optical objective 301 is not necessary due to the proximity of the window 27 to the discharge region 303. In either embodiment, the light passes through the window 27 and through a filter 305 onto a sensor 307. The sensor 307 can be any of a number of radiation sensors, for example, optical sensors, such as a phototransistor or photodiode that detect radiation in the visible spectrum. Although desirable in order to simplify data interpretation, it is not necessary for the sensor response to be linear. The filter 305 may be a band-pass filter centered at the wavelength of interest. The detector 26 may be placed directly outside of the window 27 in the foreline 18, or an optical pipe or fiber optic cable (not shown) can convey the radiation produced in the discharge region 303 to a remote location, thus conserving space around the process chamber 12.

Figure 3B:
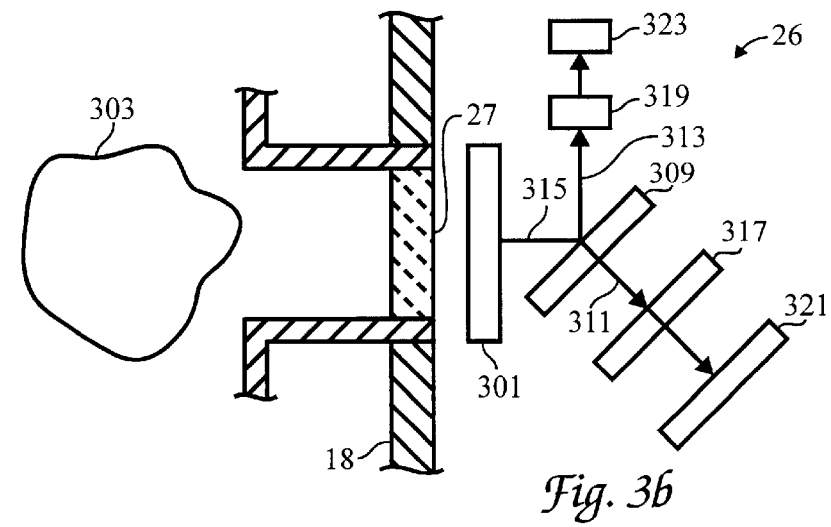

FIG. 3b is a simplified representation of a detector comprising dual-sensors. A beam splitter 309 splits the light collected by the optical objective 301 into a first beam 311 and a second beam 313. The beam intensities may be approximately equal, each being about half the intensity of the input beam 315, but could be different Intensities depending on, for example, the sensitivity of the sensors, particularly at the wavelengths of interest, and the strength of the emitted light at the wavelengths of interest. Filters 317, 319 are placed between the first beam 311 and a first sensor 321 and the second beam 313 and a second sensor 323 so that each sensor responds to a different wavelength of light. For example, one of the sensors 321, 323 may be used to monitor an indicator wavelength while the other is used to measure a wavelength characteristic of background radiation, or the sensors may be used to monitor wavelengths of different indicators. Alternatively, the background radiation can be monitored with a broad-band sensor without a filter to monitor the overall brightness of the glow discharge, to insure, for example, proper operation of the gas energizing cell or to normalize the indicator signal strength.

Figure 3C:
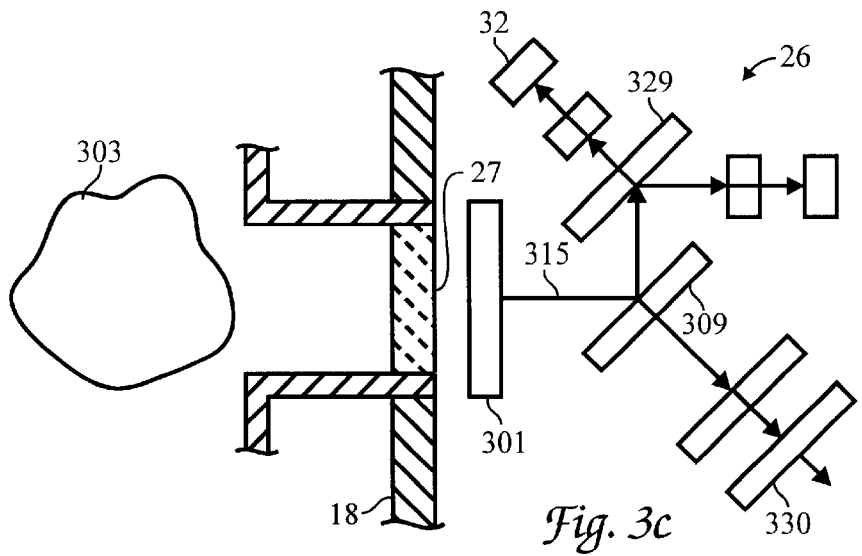

FIG. 3c is a simplified diagram of a detector 26 having multiple sensors. The first beam splitter 309 splits the input light beam 315 into multiple beams that are then split by a second beam splitter 329 into additional beams. The transmission and reflection characteristics of each beam splitter may be tailored according to the wavelengths and intensities of the peaks to be monitored, as well as the sensitivity characteristics of the sensors.

The present process monitoring system 14 has several advantages over conventional process endpoint detection methods, such as visual inspection or fixed-time methods, because the present invention determines when the effectiveness of a plasma, such as for example, a cleaning gas plasma actually drops off. With a visual inspection method, for example, monitoring a portion of the chamber 12 that is not significantly being cleaned by the plasma may cause the cleaning process to be maintained for a longer period than necessary. This would not only unduly disrupt product flow, it would also increase the use, and hence the cost and potential PFC emissions associated with the precursor gas. Fixed-time cleans, on the other hand, can result in under-cleaning if there is a change in cleaning conditions or hardware (e.g., the precursor breakdown efficiency drops due to aging of the magnetron typically used in a remote microwave plasma generator).

In addition to determining the endpoint of a cleaning process, monitoring effluent from a process chamber 12 can also be used in a number of different ways. For example, it would be desirable to know if the power output of the magnetron or the efficiency of the remote plasma generator changed. This result could be achieved by monitoring the effluent stream to detect unconverted precursor, for example, which the gas energizing cell could excite to produce a characteristic emission, even if the gas energizing cell would not substantially dissociate the precursor into a plasma. The effluent from the entire process chamber may be measured to provide information relating to average conditions in the chamber. Methods that monitor a process from a point inside the chamber must consider where the detector is placed, resulting in additional uncertainties. By incorporating information from the entire chamber volume, the present method provides a more robust indication of chamber conditions. Moreover, the effluent energizing cell 22 can be substituted for a conventional detector that monitors the in-situ plasma through a chamber window for this type of cleaning process.

Figure 4A:
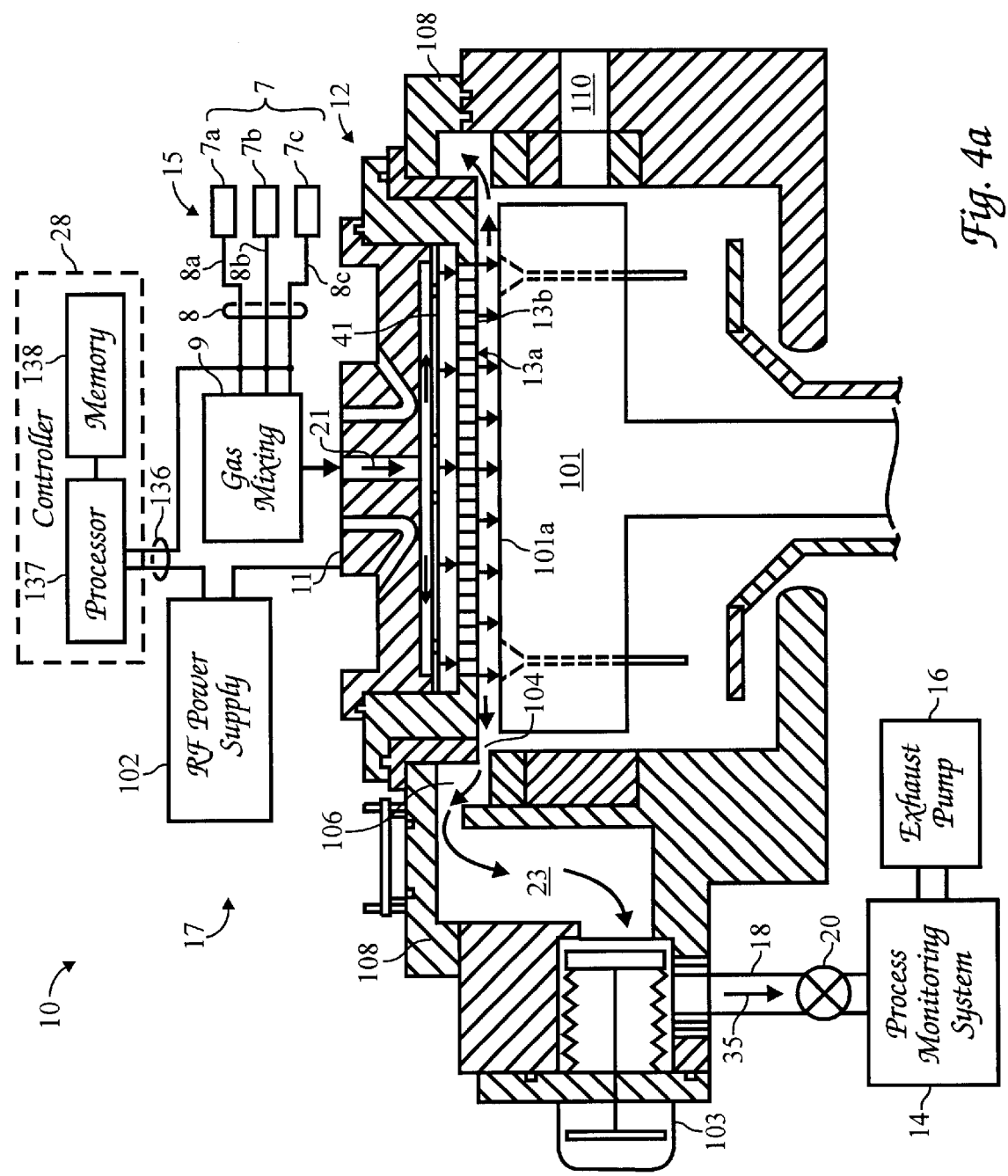
FIG. 4a is a simplified sectional diagram showing another embodiment of an exemplary substrate processing apparatus according to the present invention.

One embodiment of a substrate processing apparatus 10 according to the present invention, illustrated in FIG. 4a, is a chemical vapor disposition (CVD) system having a processing chamber 12 that includes a gas distribution manifold 11 for dispersing process gases to a substrate (not shown) that rests on a resistively-heated pedestal 101 centered within the process chamber. During processing, the substrate (e.g. a semiconductor wafer) is positioned on a flat (or slightly convex) surface 101a of the pedestal 101. Preferably, having a surface of ceramic such as aluminum nitride, pedestal 101 can be moved controllably between lower loading/off-loading position and an upper processing position that is close to the gas manifold 11. A centerboard (not shown) may include sensors to provide information on the position of the substrate. Deposition and carrier gases are introduced into chamber 12 through perforated holes 13b (FIG. 1d) of a conventional flat, circular gas distribution face plate 13a. More specifically, deposition process gases flow (indicated by arrow 21 in FIG. 4a) into the chamber through the gas manifold 11, through a conventional perforated blocker plate 41 and then through holes 13b in gas distribution faceplate 13a.

Before reaching the manifold, deposition and carrier gases are input from gas sources 7 through gas supply lines 8 (FIG. 4a) into a gas mixing block or system 9 where they are combined and then sent to the gas manifold 11. It is also possible and desirable in some instances to direct the deposition and carrier gases directly from supply lines 8 to manifold 11. In such a case, gas mixing system 9 is bypassed. In other situations, any gas lines 8 may bypass gas mixing system 9 and introduce gases through passages (not shown) in the bottom of chamber 12. As shown in FIG. 4a, there are three gas supply lines 8 in a specific embodiment to deposit $WSi_x$. A first line 8a supplies a silicon-containing gas (e.g., dichlorosilane ($SiH_2Cl_2$) referred to a "DCS" from a DCS source from gas source 7a) into gas mixing system 9, while a second line 8b supplies a tungsten containing gas (e.g., argon from argon sources in gas sources 7a and 7b) to stabilize gas flows as appropriate and to even the gas flow between the two lines into mixing system 9. Such mixing of gases (DCS and $WF_6$) upstream of chamber 12 is believed to result in more uniform gas distribution into the chamber, thereby resulting in greater uniformity in the deposited $WSi_x$ film. A third supply line 8c introduces an inert purge gas (e.g., argon from gas source 7c) from the bottom of the chamber to keep deposition gases away from the area of the chamber below a heater (not shown). In some preferred embodiments, an additional silicon source (e.g., silane ($SiH_4$) from source 7a may be supplied to gas line 8a. Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, several safety shut-off valves are positioned on each supply line in conventional configurations.

The deposition process performed in chamber 12 can be either a thermal process or a plasma-enhanced process. In a plasma-enhanced process, an RF power supply 102 applies electrical power between the gas distribution faceplate 13a and pedestal 101 to excite the process gas mixture to form a plasma within the cylindrical region between the faceplate 13a and pedestal 101. (This region will be referred to herein as the "reaction region"). Constituents of the plasma react to deposit a desired film on the surface of the semiconductor wafer supported on pedestal 101. RF power supply 102 can be a mixed frequency RF power supply that typically supplies power at a high RF frequency (RF1) of 13,56 Megahertz (MHz) and at a low RF frequency (RF2) of 360 kilohertz (kHz) to enhance the decomposition of reactive species introduced into the chamber 12. Of course, RF power supply 102 can supply either single-or mixed-frequency RF power (or other desired variations) to manifold 11 to enhance the decompositions of reactive species introduced into chamber 12. In a thermal process, RF power supply 102 is not utilized, and the process gas mixture thermally reacts to deposit the desired film on the surface of the substrate supported on pedestal 101, which is resistively heated to provide the thermal energy needed for the reaction.

During a plasma-enhanced deposition process, the plasma heats the entire chamber 12, including the walls surrounding the exhaust passageway 23 and the shut off valve 103. During a thermal deposition process, heated pedestal 101 causes heating of the chamber 12. When the plasma is not turned on, or during a thermal deposition process, a hot liquid is circulated through the walls of the chamber 12 to maintain the chamber at an elevated temperature. Fluids used to heat the chamber walls include typical water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow.

The remainder of the gas mixture that is not deposited in a layer, including reaction products and effluent residue deposits, is evacuated from the chamber 12 by an exhaust pump 16. Specifically, the gases are exhausted through an annular, slot-shaped orifice 104 surrounding the reaction region and into an annular exhaust plenum 106. The annular orifice 104 and the plenum 106 are defined by the gap between the top of the chamber's cylindrical side wall (including the isolator 37 on the wall) and the bottom of the circular chamber lid 108. The 360° circular symmetry and uniformity of the slot orifice 104 and the plenum 106 are important to achieving a uniform flow of process gases over the substrate to deposit a more uniform film. The gases flow underneath a lateral extension portion 21 of the exhaust plenum 106 through a downward-extending gas passage 23, past a vacuum shut-off valve 103 (whose body is integrated with the lower chamber wall) and into the exhaust outlet 109 that connects to the external vacuum pump 16 through the foreline 18

The wafer support platter of resistively-heated pedestal 101 may be heated using an embedded single loop embedded heater element configured o make two full turns in the form of parallel concentric circles. An outer portion of the heater element runs adjacent to a perimeter of the support platter , while an inner portion runs on the path of a concentric circle having a smaller radius. The wiring to the heating element passes through the stem of pedestal 101 which may be made of aluminum, ceramic, or some combination thereof. Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao, et al., hereby incorporated by reference in its entirety. A lift mechanism and motor (not shown) may be used to raise and lower the heater pedestal 101 and substrate lift pins (not shown) are transferred by a robot blade (not shown) into and out of the body of the chamber through an insertion/removal opening 110 in the side of the chamber 12. The motor raises and lowers the pedestal 101 between processing and substrate loading positions and optical sensors may be used to determine the position of the movable assemblies such as for example, the throttle valve 20 and pedestal 101 which are moved by appropriate motors.

The apparatus is operated by a system controller 28 that includes a hard disk drive (memory 138), a floppy disk drive and a processor 137. The processor contains a single-board computer (SBC), analog and digital input/output boards, interface boards and stepper motor controller boards. Various parts of apparatus 10 conform to the Versa Modular European (VME) standard which defines board, card cage, and connector dimensions and types. The VME standard also defines the bus structure as having a 16-bit data bus and a 24-bit address bus. The controller 28 executes system control software, which is a computer program stored in a computer readable medium such as memory 138. Preferably, memory 138 uses a hard disk drive, but memory 138 may also be other kinds of memory. The computer program includes a set of instructions that dictate the timing, mixture of gases, chamber pressure, chamber temperature, RF power levels pedestal position and other parameters of a particular process. Other computer programs stored on other memory devices including, for example, a floppy disk or other another appropriate drive, may also be used to operate controller 28.

Figure 4B:
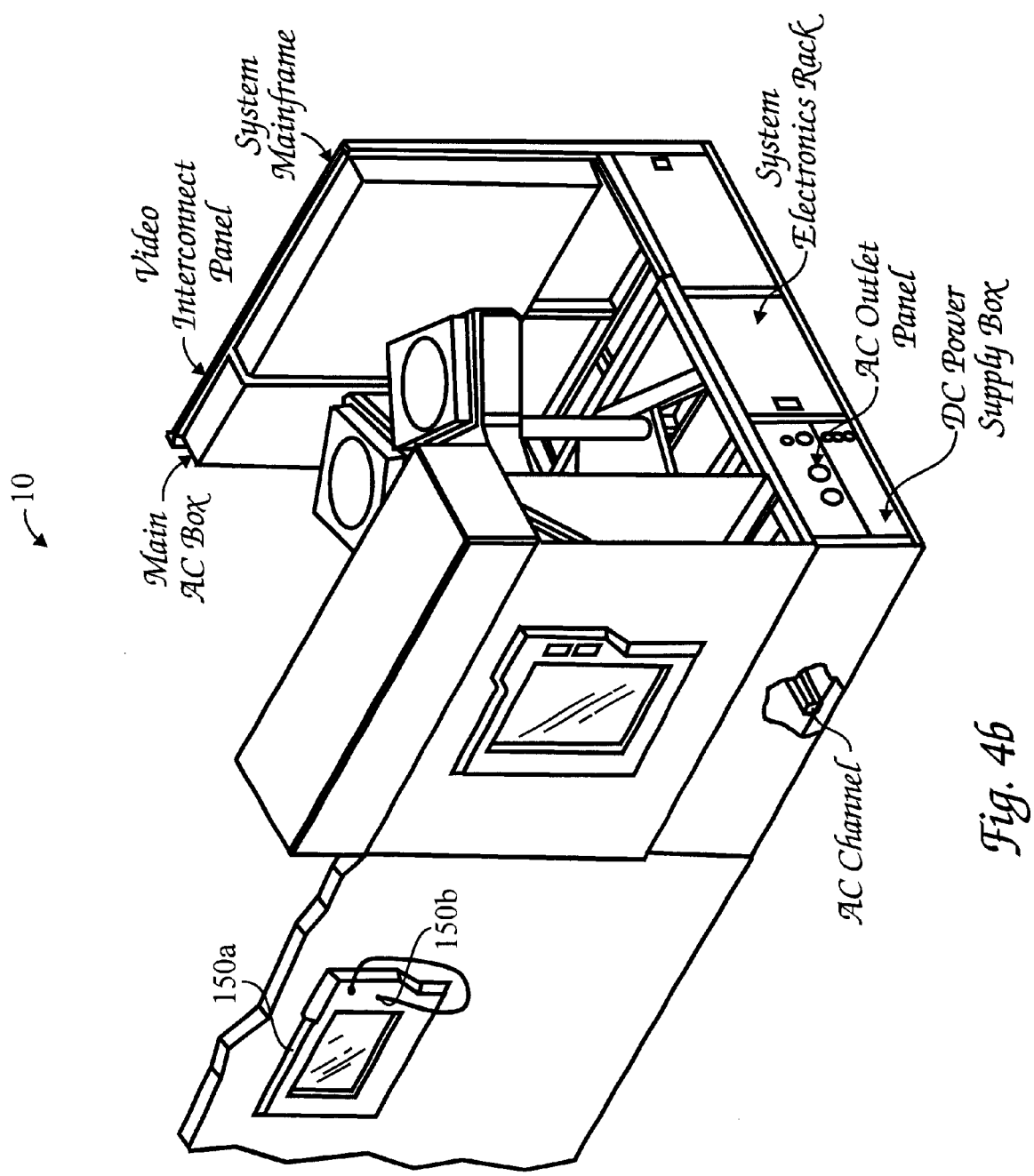
FIG. 4b is a simplified diagram of a substrate processing apparatus comprising a process system monitor and a CVD chamber.

The interface between a user and controller 28 is via a CRT monitor 150a and light pen 150b, shown in FIG. 4b, which is a simplified diagram of a CVD apparatus 10 which may include one or more chambers. In the preferred embodiment two monitors 150a are used, one mounted in the clean room wall for the operators and the other behind the wall for the service technicians. The monitors 150a simultaneously display the same information, but only one light pen 150b is enabled. A light sensor in the tip of the light pen 150b detects light emitted by CRT display. To select a particular screen or function, the operator touches a designated area of the display screen and pushes the button on the pen 150b. The touched area changes its highlighted color, or a new menu or screen is displayed, confirming communication between the light pen 150b and the display screen. Other devices, such as a keyboard, mouse, or other pointing or communication device may be used instead of, or in addition to, light pen 150b to allow the user to communicate with controller 28.

The process for depositing the film can be implemented using a computer program product that is executed by controller 28. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer usable medium, such as a memory system of a computer. If the entered code text is in a high level language, the code is compiled, and the resultant compiler code is then linked with an object code of precompiled Windows™ library routines. To execute the linked, compiled object code the system user invokes the object code, causing the computer system to load the code in the memory. The CPU then reads and executes the code to perform the tasks identified in the program.

Figure 4C:
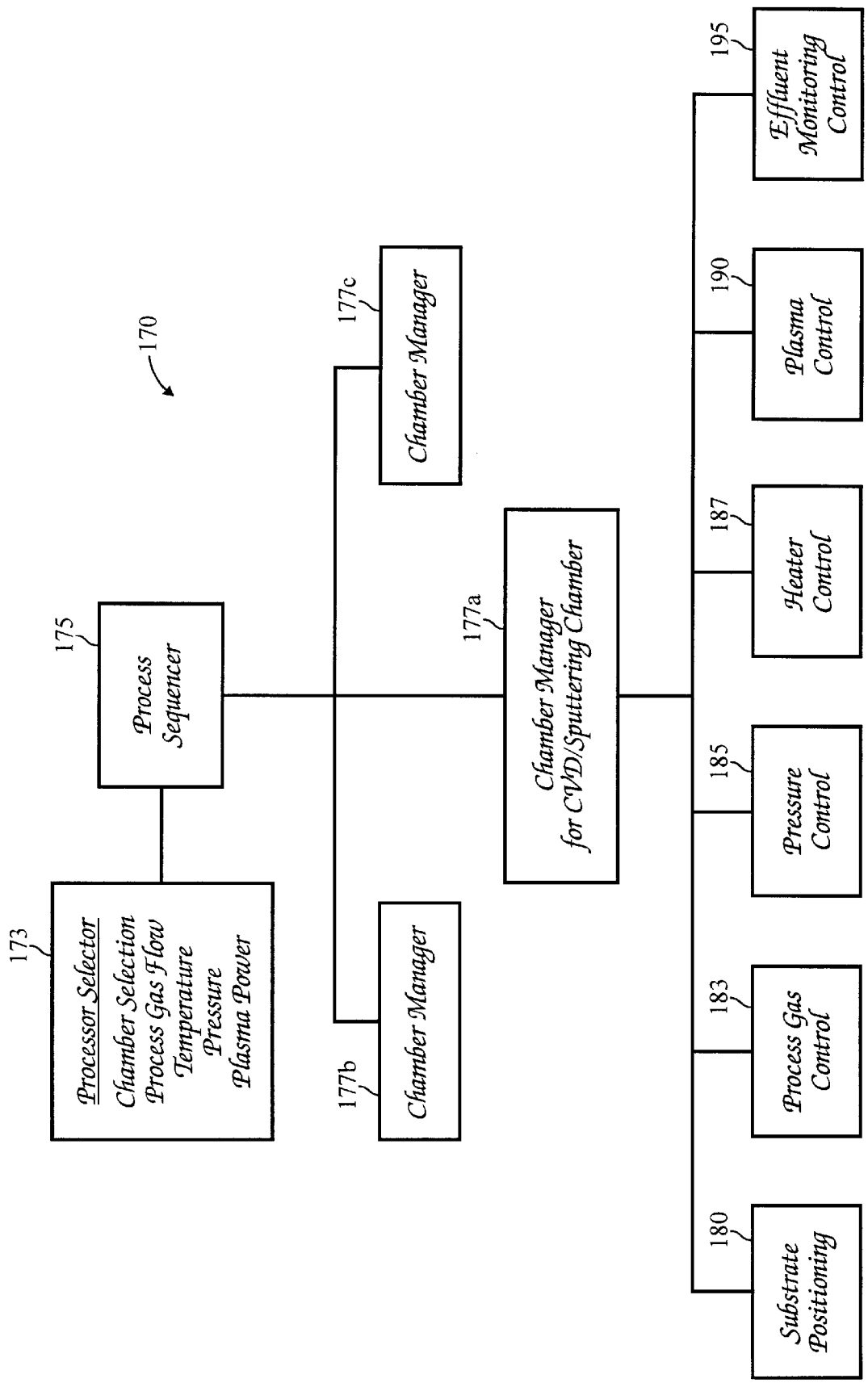
FIG. 4c is an illustrative block diagram of a hierarchical control structure of a computer program according to the present invention.

FIG. 4c is an illustrative block diagram of the hierarchical control structure of a control software computer program 170, according to a specific embodiment. Using the light pen 150b a user enters a process set number and process chamber number into a process selector subroutine 173 in a response to menus or screens displayed on the CRT monitor. The process sets are predetermined sets of process parameters necessary to carry out specified processes, and are identified by predefined set numbers. The process selector subroutine 173 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low frequency RF frequency, cooling gas pressure, and chamber wall temperature. These parameters are provided to the user in the form of a recipe and are entered utilizing the light pen/CRT monitor interface. The signals for monitoring the process are provided by the analog and digital input boards of the system controller, and the signals for controlling the process are output on the analog and digital output boards of the apparatus 10.

The process sequencer subroutine 175 comprises program code for accepting the identified process chamber and set of process parameters from the process selector subroutine 173, and for controlling operation of the various process chambers. Multiple users can enter process set numbers and process chamber numbers, or a single user can enter multiple process set numbers and process chamber numbers, so sequencer subroutine 175 operates to schedule the selected processes in the desired sequence. Preferably the sequencer subroutine 175 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 175 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 175 determines which process chamber and process set combination is going to be executed next, the sequencer subroutine 175 initiates execution of the process set by passing the particular process set parameters to a chamber manager subroutine 177a–c that controls multiple processing tasks in a process chamber 12 according to the process set determined by sequencer subroutine 175. For example, the chamber manager subroutine 177a comprises program code for controlling CVD operations in the process chamber 12. Chamber manager subroutine 177a also controls execution of various chamber component subroutines that control operation of the chamber components necessary to carry out the selected process set. Examples of chamber component subroutines are substrate positioning subroutine 180, process gas control subroutine 183, pressure control subroutine 185, heater control subroutine 187, and plasma control subroutine 190, and effluent monitoring control 192. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber 12. In operation, the chamber manager subroutine 177a selectively schedules or calls the process component subroutines in accordance with the particular process set being executed. Chamber manager subroutine 177a schedules the process component subroutines much like sequencer subroutine 175 schedules which process chamber 12 and process set are to be executed next. Typically, chamber manager subroutine 177a includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 4c. Substrate positioning subroutine 180 comprises program code for controlling chamber components that are used to load the substrate onto the pedestal 101 and, optionally, to lift the substrate to a desired height in the chamber 12 to control the spacing between the substrate and gas distribution manifold 11. When a substrate is loaded into the process chamber 12, pedestal 101 is lowered to receive the substrate, and thereafter is raised to the desired height. In operation, substrate positioning subroutine 180 controls movement of pedestal 101 in response to process set parameters related to the support height that are transferred from chamber manager subroutine 177a.

Process gas control subroutine 183 has program code for controlling process gas composition and flow rates. Process gas control subroutine 183 controls the open/close position of the safety shut-off valves, and also ramps up/down the mass flow controllers to obtain the desired gas flow rate. Process gas control subroutine 183 is invoked by the chamber manager subroutine 177a, as are all chamber component subroutines, and receives subroutine process parameters related to the desired gas flow rates. Typically, process gas control subroutine 183 operates by opening the gas supply lines, and repeatedly (i) reading the necessary mass flow controllers, (ii) comparing the readings to the desired flow rates received from chamber manager subroutine 177a, and (iii) adjusting the flow rates of the gas supply lines as necessary. Furthermore, process gas control subroutine 183 includes steps for monitoring the gas flow rates for unsafe rates, and activating the safety shut-off valves when an unsafe condition is detected.

In some processes, an inert gas such as nitrogen or argon is flowed into chamber 12 to stabilize the pressure in the chamber before reactive process gases are introduced. For these processes, process gas control subroutine 183 is programmed to include steps for flowing the inert gas into chamber 12 for an amount of time necessary to stabilize the pressure in the chamber, and then the steps described above would be carried out. Additionally, when a process gas is to be vaporized from a liquid precursor, for example TEOS, process gas control subroutine 183 is written to include steps for bubbling a delivery gas, such as helium, through the liquid precursor in a bubbler assembly, or for introducing a carrier gas, such as helium, to a liquid injection system. When a bubbler is used for this type of process, process gas control subroutine 185 regulates the flow of the delivery gas, the pressure in the bubbler, and the bubbler temperature in order to obtain the desired process gas flow rates. As discussed above, the desired process gas flow rates are transferred to the process gas control subroutine 185 as process parameters. Furthermore, the process gas control subroutine 185 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure, and bubbler temperature are monitored, compared with the necessary values, and adjusted accordingly.

The pressure control subroutine 185 comprises program code for controlling the pressure in the chamber 12 by regulating the aperture size of the throttle valve in the exhaust system of the chamber. The aperture size of the throttle valve 20 is set to control the chamber pressure at a desired level in relation to the total process gas flow, the size of the process chamber 12, and the pumping set-point pressure for the exhaust system. When the pressure control subroutine 185 is invoked, the desired or target pressure level is received as a parameter from chamber manager subroutine 177a. The pressure control subroutine 185 measures the pressure in the chamber 12 by reading one or more conventional pressure manometers connected to the chamber 12, compares the measure value(s) with the target pressure, obtains PID (proportional, integral, and differential) values corresponding to the target pressure from a stored pressure table, and adjusts the throttle valve according to the PID values obtained from the pressure table. Alternatively, pressure control subroutine 185 can be written to open or close the throttle valve to a particular aperture size to regulate the pumping capacity in chamber 12 to the desired level.

Heater control subroutine 187 comprises program code for controlling the current to a heating unit that is used to heat the substrate 20. The heater control subroutine 187 is also invoked by the chamber manager subroutine 177a and receives a target, or set-point, temperature parameter. The heater control subroutine 187 measures the temperature by measuring voltage output of a thermocouple located in pedestal 101, comparing the measured temperature with the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 101, heater control subroutine 187 gradually controls a ramp up/down of current applied to the loop. Additionally, a built-in, fail-safe mode can be included to detect process safety compliance, and can shut down operation of the heating unit if the process chamber 12 is not properly set up.

The plasma control subroutine 190 comprises program code for setting low- and high-frequency RF power levels applied to the process electrodes in chamber 12 and for setting the low and high RF frequency employed. Plasma control subroutine 190 also includes program code for turning on and setting/adjusting the power levels applied to the magnetron or other microwave source used in the present invention. Similarly to the previously described chamber component subroutines, the plasma control subroutine 190 is invoked by chamber manager subroutine 177a.

The effluent monitoring subroutine 195 comprises program code for setting the RF power and frequency levels applied to the electrodes in the gas energizing cell 22. It also includes program code for turning on and setting/adjusting the detector 26, for example to adjust the operating power levels of the sensors or to adjust the detector optics. The effluent monitoring subroutine 195 is also invoked by chamber manager subroutine 177a. The subroutine 195 may also send instructions to the controller 28 or other chamber components to terminate the process upon, for example, detecting an endpoint of a process conducted in the chamber from the effluent composition, for example an endpoint of a chamber cleaning composition.

The above description is mainly for illustrative purposes, and other equipment such as electroncyclotron resonance (ECR) plasma CVD devices, indiction coupled RF high density plasma CVD devices, or the like may be used with the present invention to provide upgraded apparatus. Additionally, variations of the above-described system, such as variations in pedestal design, heater design, RF power frequencies, location of RF power connections and others are possible. For example, the substrate could be supported and heated by quartz lamps. It should be recognized that the present invention is not necessarily limited to use with or retrofitting of any specific apparatus.

The present invention has now been described with reference to the preferred embodiments and specific examples. Alternatives and substitutions will now be apparent to persons of skill in the art. For example, the process chamber could be a PECVD or PVD chamber or the gas energizing cell and detector may be placed in different locations or configurations. Multiple detectors may be configured in a variety of ways, including by providing multiple windows around the glow discharge region. Furthermore, the film to be cleaned during a cleaning process could be silane-based silicon oxide, silicon nitride, metal, semiconductor material, or other material. Accordingly, the above description is not intended to limit the invention as provided in the following claims.

What is claimed is:

1. An effluent monitoring apparatus comprising:
   a cell adapted to receive an effluent;
   a gas energizer capable of energizing the effluent in the cell thereby emitting a radiation;
   a radiation permeable window in a wall of the cell, the window being in a portion of the wall which is recessed by a distance d that is sufficiently high to reduce a deposition of effluent residue from the energized gas on the window; and a detector to detect the radiation.

2. An apparatus according to claim 1 wherein the distance d is of from about 3 mm to about 15 mm.

3. An apparatus according to claim 1 wherein the window is in a port.

4. An apparatus according to claim 3 wherein the port comprises a width of from about 3 mm to about 15 mm.

5. An apparatus according to claim 3 wherein the port is oriented to have a field of view that covers substantially only an electrode in the cell.

6. An apparatus according to claim 3 wherein the detector is adapted to have a field of view that covers substantially only an electrode in the cell.

7. An apparatus according to claim 1 wherein the detector is adapted to detect radiation having preselected wavelengths in the optical, infra-red or ultra-violet spectrum.

8. An apparatus according to claim 7 wherein the preselected wavelengths are wavelengths emitted by an excited halogen species in the energized gas.

9. An apparatus according to claim 1 wherein the gas energizer comprises electrodes that may be energized to form a plasma in the chamber.

10. An effluent monitoring apparatus comprising:
   an effluent energizing cell adapted to receive an effluent;
   a gas energizer capable of energizing the effluent in the effluent energizing cell thereby emitting a radiation;
   a window assembly comprising a radiation permeable portion in a port which has an aspect ratio that is sufficiently high to reduce a deposition of effluent residue from the energized gas on the window; and
   a detector to detect the radiation.

11. An apparatus according to claim 10 wherein the port comprises a depth of about 2 mm to about 70 mm.

12. An apparatus according to claim 10 wherein the port comprises a width of from about 3 mm to about 15 mm.

13. An apparatus according to claim 10 wherein the detector is adapted to have a field of view that covers substantially only an electrode in the cell.

14. An apparatus according to claim 10 wherein the port is oriented to have a field of view that covers substantially only an electrode in the cell.

15. An apparatus according to claim 10 wherein the detector is adapted to detect radiation having preselected wavelengths in the optical, infra-red or ultra-violet spectrum.

16. An apparatus according to claim 15 wherein the preselected wavelengths are wavelengths emitted by an excited halogen species in the energized gas.

17. An apparatus according to claim 10 wherein the gas energizer comprises electrodes that may be energized to form a plasma in the chamber.

18. A method of monitoring a composition of an effluent from a process chamber, the method comprising:
   introducing the effluent into an effluent energizing cell;
   energizing the effluent in the cell;
   maintaining a radiation permeable window in a wall of the cell, the window being in a portion of the wall which is recessed by a distance d that is sufficiently large to reduce the deposition of effluent residue on the window; and
   detecting a radiation emanating from the energized gas and passing through the window.

19. A method according to claim 18 comprising maintaining the radiation permeable window at a distance d of from about 2 mm to about 70 mm.

20. A method according to claim 18 comprising detecting radiation emanating substantially only from in front of an electrode in the cell.

21. A method according to claim 20 comprising detecting a radiation in a field of view that covers substantially only a surface of the electrode.

22. A method according to claim 18 comprising detecting radiation having preselected wavelengths in the optical, infra-red or ultraviolet range.

23. A method according to claim 22 comprising the detecting radiation having wavelengths emitted by an excited halogen species in the energized gas.

24. A method according to claim 22 comprising energizing the gas to capacitively couple electromagnetic energy to the gas in the cell.

25. A chamber cleaning apparatus comprising:
   a chamber comprising a support capable of supporting a substrate during processing, a gas supply to provide a cleaning gas to the chamber, a gas energizer to energize the cleaning gas, and an exhaust to remove spent cleaning gas from the chamber; and
   a process monitoring system comprising a gas energizing cell in the exhaust to receive spent cleaning gas, a gas energizer capable of energizing the gas in the cell, a window assembly comprising a radiation permeable portion in a wall of the cell, the radiation permeable portion being in a portion of the wall which is recessed by a distance d that is sufficiently large to reduce the deposition of effluent residue on the radiation permeable portion, and a detector to detect a radiation emanating from the energized gas.

26. An apparatus according to claim 25 wherein the distance d of the radiation permeable portion recessed from the wall of the cell is from about 2 mm to about 70 mm.

27. An apparatus according to claim 25 wherein the detector is oriented to face an electrode in the cell.

28. An apparatus according to claim 27 wherein the detector comprises a field of view that is limited to cover substantially only the electrode.

29. An effluent monitoring apparatus comprising:
   a cell to receive effluent, wherein the cell has at least one wall;
   one or more electrodes in the cell that are chargeable to form a plasma from the effluent in the cell; and
   a detector assembly comprising a radiation permeable window, and a sensor behind the window to detect radiation emanating from the plasma, and optional optics, wherein the window is in a portion of the wall of the cell which is recessed,
   wherein the detector assembly is set to selectively receive radiation originating from the front of an electrode in the cell.

30. An apparatus according to claim 29 wherein the detector assembly is adapted to face an electrode.

31. An apparatus according to claim 29 wherein the detector assembly comprises a field of view that covers substantially only an electrode.

32. An apparatus according to claim 29 wherein the sensor is adapted to detect radiation having preselected wavelengths in the optical, infra-red, ultra-violet.

33. An apparatus according to claim 32 wherein the preselected wavelengths are wavelengths emitted by an excited halogen species in the energized gas.

34. An apparatus according to claim 32 wherein the radiation permeable window is in a portion of the wall of the cell which is recessed by a distance d that is sufficiently large to reduce the deposition of effluent residue on the window.

35. A method of monitoring an effluent, the method comprising:

introducing an effluent into a cell having at least one wall;

applying a bias voltage to one or more electrodes in the cell to form a plasma of the effluent;

providing a radiation permeable window in the cell, wherein the radiation permeable window is in a portion of the wall of the cell which is recessed; and detecting radiation emanating from the front of an electrode.

36. A method according to claim 35 comprising detecting radiation in a field of view covering a surface of an electrode in the cell.

37. A method according to claim 35 comprising setting the detector to detect radiation originating substantially only from the front of the electrode.

38. A method according to claim 35 comprising detecting radiation having wavelengths emitted by an excited halogen species in the energized gas.

39. A method according to claim 35 comprising maintaining the radiation permeable window recessed at a distance d from a wall of the cell that is sufficiently large to reduce the deposition of effluent residue on the window.

40. A chamber cleaning apparatus comprising:

a chamber comprising a support capable of supporting a substrate during processing, a gas supply to provide a cleaning gas to the chamber, a first gas energizer to energize the cleaning gas, and an exhaust to exhaust the cleaning gas; and a process monitoring system comprising a cell adapted to receive the cleaning gas, wherein the cell has at least one wall, electrodes that may be energized to energize the cleaning gas in the cell, a detector assembly comprising a radiation permeable window in a wall of the cell, the radiation permeable window being in a portion of the wall which is recessed by a distance d that is sufficiently large to reduce a deposition of effluent residue on the radiation permeable window, and a detector to detect radiation emanating from the energized gas in front of the electrode.

41. An apparatus according to claim 40 wherein the detector assembly is oriented to face an electrode in the cell.

42. An apparatus according to claim 40 wherein the detector assembly comprises a field of view that covers substantially only an electrode.

43. An apparatus according to claim 40 wherein the detector is adapted to detect preselected wavelengths emitted by excited halogen species in the energized gas.

44. An apparatus according to claim 43 wherein the distance d is from about 2 mm to about 70 mm.

* * * * *